United States Patent
Sasaki

(10) Patent No.: US 11,133,382 B2
(45) Date of Patent: Sep. 28, 2021

(54) SEMICONDUCTOR NANOPARTICLE, SEMICONDUCTOR NANOPARTICLE-CONTAINING DISPERSION LIQUID, AND FILM

(71) Applicant: FUJIFILM Corporation, Tokyo (JP)

(72) Inventor: Tsutomu Sasaki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 86 days.

(21) Appl. No.: 16/660,236

(22) Filed: Oct. 22, 2019

(65) Prior Publication Data

US 2020/0052068 A1    Feb. 13, 2020

Related U.S. Application Data

(63) Continuation of application No. PCT/JP2018/014127, filed on Apr. 2, 2018.

(30) Foreign Application Priority Data

Apr. 25, 2017  (JP) .............................. JP2017-085971

(51) Int. Cl.
  *H01L 29/06* (2006.01)
  *H01L 29/205* (2006.01)
  *H01L 29/225* (2006.01)

(52) U.S. Cl.
  CPC ........ *H01L 29/0665* (2013.01); *H01L 29/205* (2013.01); *H01L 29/225* (2013.01)

(58) Field of Classification Search
  CPC ..... B82Y 20/00; B82Y 30/00; H01L 29/0665; H01L 29/127; H01L 29/205; H01L 29/225; H01L 29/267; H01L 29/78681; H01L 29/7869; H01L 31/035218; H01L 31/055
  See application file for complete search history.

(56) References Cited

U.S. PATENT DOCUMENTS

| | | |
|---|---|---|
| 2011/0227007 A1 | 9/2011 | Kang et al. |
| 2015/0218442 A1 | 8/2015 | Jun et al. |
| 2016/0272883 A1 | 9/2016 | Yamane et al. |
| 2017/0247613 A1 | 8/2017 | Ono |
| 2018/0066182 A1 | 3/2018 | Ono |
| 2019/0211261 A1* | 7/2019 | Jang ...................... C08F 220/06 |

FOREIGN PATENT DOCUMENTS

| | | |
|---|---|---|
| JP | 2011-194562 A | 10/2011 |
| JP | 2012-144587 A | 8/2012 |
| JP | 2015-147726 A | 8/2015 |
| JP | 2016-172829 A | 9/2016 |
| WO | 2016/080435 A1 | 5/2016 |
| WO | 2016/185933 A1 | 11/2016 |

OTHER PUBLICATIONS

International Search Report issued in PCT/JP2018/014127; dated Jun. 5, 2018.
International Preliminary Report on Patentability and Written Opinion issued in PCT/JP2018/014127; dated Oct. 29, 2019.
Kim, Sungwoo et al., Highly Luminescent InP/GaP/ZnS Nanocrystals and Their Application to White Light-Emitting Diodes, Journal of the American Chemical Society, Feb. 3, 2012, vol. 134, No. 8, pp. 3804-3809 ISSN: 0002-7863.
An Office Action; "Notice of Reasons for Refusal," mailed by the Japanese Patent Office dated Nov. 10, 2020, which corresponds to Japanese Patent Application No. 2019-515187 and is related to U.S. Appl. No. 16/660,236; with English language translation.
An Office Action mailed by the Korean Intellectual Property Office dated Jun. 11, 2021, which corresponds to Korean Patent Application No. 10-2019-7031196 and is related to U.S. Appl. No. 16/660,236; with English language translation.

* cited by examiner

*Primary Examiner* — Allan R Wilson

(74) *Attorney, Agent, or Firm* — Studebaker & Brackett PC

(57) ABSTRACT

An object of the present invention is to provide a semiconductor nanoparticle exhibiting excellent air durability, a semiconductor nanoparticle-containing dispersion liquid containing the semiconductor nanoparticle, and a film containing the semiconductor nanoparticle. In the semiconductor nanoparticle of the present invention, zinc, sulfur, and indium are detected by energy dispersive X-ray analysis, and a molar ratio Zn/In of zinc to indium which is acquired by the energy dispersive X-ray analysis satisfies Expression (1a).

$$7 \leq Zn/In \leq 15 \tag{1a}$$

23 Claims, No Drawings

SEMICONDUCTOR NANOPARTICLE, SEMICONDUCTOR NANOPARTICLE-CONTAINING DISPERSION LIQUID, AND FILM

CROSS-REFERENCE TO RELATED APPLICATIONS

This application is a Continuation of PCT International Application No. PCT/JP2018/014127 filed on Apr. 2, 2018, which claims priority under 35 U.S.C. § 119(a) to Japanese Patent Application No. 2017-085971 filed on Apr. 25, 2017. The above application is hereby expressly incorporated by reference, in its entirety, into the present application.

BACKGROUND OF THE INVENTION

1. Field of the Invention

The present invention relates to a semiconductor nanoparticle, a semiconductor nanoparticle-containing dispersion liquid, and a film.

2. Description of the Related Art

Colloidal semiconductor nanoparticles (hereinafter, also referred to as "quantum dots") in a single nano-sized level which are obtained by a chemical synthesis method from a solution containing metal elements are started to be practically used as a fluorescent material in a wavelength conversion film for some display applications and also expected to be applied to biological labels, light emitting diodes, solar cells, thin film transistors, and the like. WO2016/080435A is exemplified as a document that discloses semiconductor nanoparticles.

SUMMARY OF THE INVENTION

Under the above-described background, semiconductor nanoparticles were produced with reference to WO2016/080435A and were applied to various applications, and as a result, the present inventors found that characteristics (quantum yield and the like) are degraded under the environment exposed to the air, such as production process and actual use, in some cases.

The present invention has been made in consideration of the above-described circumstances, and an object of the present invention is to provide a semiconductor nanoparticle exhibiting excellent air durability, a semiconductor nanoparticle-containing dispersion liquid containing the semiconductor nanoparticle, and a film containing the semiconductor nanoparticle. The air durability means that degradation of the characteristics (quantum yield and the like) in the air is unlikely to occur.

As described above, from the research conducted by the present inventors, it is found that the characteristics such as quantum yield are degraded in a case where semiconductor nanoparticles are exposed to the air. In addition, as the result of further research, the present inventors also found that the above-described degradation of the characteristics is mainly caused by the oxidation due to oxygen or moisture in the air.

Under the above-described circumstances, as the result of the research focused on a molar ratio Zn/In of zinc to indium, the present inventors found that a remarkable correlation is observed between the molar ratio and the oxidation, and the oxidation can be remarkably suppressed by setting the molar ratio within a specific range.

The present invention is based on the above-described findings, and the specific configurations are as follows.

(1) A semiconductor nanoparticle, in which zinc, sulfur, and indium are detected by energy dispersive X-ray analysis, and a molar ratio Zn/In of zinc to indium which is acquired by the energy dispersive X-ray analysis satisfies Expression (1a).

$$7 \leq Zn/In \leq 15 \qquad (1a)$$

(2) The semiconductor nanoparticle according to (1), in which a peak A is detected in 300 to 400 $cm^{-1}$ and a peak B is detected in 100 to 130 $cm^{-1}$ by Raman spectroscopy.

(3) The semiconductor nanoparticle according to (2), in which an intensity ratio B/A of the peak B to the peak A satisfies Expression (2a).

$$0 < B/A < 3 \qquad (2a)$$

(4) The semiconductor nanoparticle according to (3), in which the intensity ratio B/A of the peaks satisfies Expression (2b).

$$0.5 \leq B/A \leq 1.5 \qquad (2b)$$

(5) The semiconductor nanoparticle according to any one of (1) to (4), in which the molar ratio Zn/In satisfies Expression (1b).

$$7 \leq Zn/In \leq 12 \qquad (1b)$$

(6) The semiconductor nanoparticle according to (5), in which the molar ratio Zn/In satisfies Expression (1c).

$$9 \leq Zn/In \leq 12 \qquad (1c)$$

(7) The semiconductor nanoparticle according to any one of (1) to (6), in which an average particle diameter is 6 nm or less.

(8) The semiconductor nanoparticle according to (7), in which the average particle diameter is 3.5 nm to 5.5 nm.

(9) The semiconductor nanoparticle according to any one of (1) to (8) comprising: a core which contains a Group III element and a Group V element; and a shell which covers at least a part of a surface of the core and contains a Group II element and a Group VI element.

(10) The semiconductor nanoparticle according to any one of (1) to (8) comprising: a core which contains a Group III element and a Group V element; a first shell which covers at least a part of a surface of the core; and a second shell which covers at least a part of the first shell.

(11) The semiconductor nanoparticle according to (9) or (10), in which the Group III element contained in the core is In, and the Group V element contained in the core is any one of P, N, or As.

(12) The semiconductor nanoparticle according to (11), in which the Group III element contained in the core is In, and the Group V element contained in the core is P.

(13) The semiconductor nanoparticle according to any one of (9) to (12), in which the core further contains a Group II element.

(14) The semiconductor nanoparticle according to (13), in which the Group II element contained in the core is Zn.

(15) The semiconductor nanoparticle according to any one of (10) to (14), in which the first shell contains a Group II element or a Group III element, and in a case where the first shell contains the Group III element, the Group III element contained in the first shell is a Group III element different from the Group III element contained in the core.

(16) The semiconductor nanoparticle according to any one of (10) to (15), in which the first shell is a Group II-VI semiconductor which contains a Group II element and a Group VI element or a Group III-V semiconductor which contains a Group III element and a Group V element, and in a case where the first shell is the Group III-V semiconductor, the Group III element contained in the Group III-V semiconductor is a Group III element different from the Group III element contained in the core.

(17) The semiconductor nanoparticle according to (16), in which, in a case where the first shell is the Group II-VI semiconductor, the Group II element is Zn and the Group VI element is Se or S, and in a case where the first shell is the Group III-V semiconductor, the Group III element is Ga and the Group V element is P.

(18) The semiconductor nanoparticle according to (16), in which the first shell is the Group III-V semiconductor, the Group III element is Ga, and the Group V element is P.

(19) The semiconductor nanoparticle according to any one of (10) to (18), in which the second shell is a Group II-VI semiconductor which contains a Group II element and a Group VI element or a Group III-V semiconductor which contains a Group III element and a Group V element.

(20) The semiconductor nanoparticle according to (19), in which the second shell is the Group II-VI semiconductor, the Group II element is Zn, and the Group VI element is S.

(21) The semiconductor nanoparticle according to any one of (10) to (20), in which the core, the first shell, and the second shell are respectively a crystal system having a zinc blende structure.

(22) The semiconductor nanoparticle according to any one of (10) to (21), in which, among the core, the first shell, and the second shell, a band gap of the core is the smallest, and the core and the first shell respectively have a type 1 band structure.

(23) A semiconductor nanoparticle-containing dispersion liquid comprising the semiconductor nanoparticle according to any one of (1) to (22).

(24) A film comprising the semiconductor nanoparticle according to any one of (1) to (22).

As described below, according to the present invention, it is possible to provide a semiconductor nanoparticle exhibiting excellent air durability, a semiconductor nanoparticle-containing dispersion liquid containing the semiconductor nanoparticle, and a film containing the semiconductor nanoparticle.

DESCRIPTION OF THE PREFERRED EMBODIMENTS

Hereinafter, the present invention will be described in detail.

The description of constituent elements below will be occasionally made based on representative embodiments of the present invention, but the present invention is not limited to these embodiments.

In the present specification, the numerical ranges expressed using "to" in the present specification indicate the ranges including the numerical values described before and after "to" as the lower limits and the upper limits.

[Semiconductor Nanoparticles]

In a semiconductor nanoparticle according to an embodiment of the present invention, zinc, sulfur, and indium are detected by energy dispersive X-ray analysis (hereinafter, also referred to as "EDX analysis" or simply "EDX"), and a molar ratio Zn/In (hereinafter, also referred to as the "Zn/In" or the "Zn/In (EDX)") of zinc to indium which is acquired by the energy dispersive X-ray analysis (EDX) satisfies Expression (1a).

$$7 \leq Zn/In \leq 15 \quad (1a)$$

The semiconductor nanoparticle according to the embodiment of the present invention is considered to exhibit excellent air durability by employing the above-described configuration. The reason for this is not clear in detail, but in the semiconductor nanoparticle according to the embodiment of the present invention, the reason is assumed that, since the molar ratio of Zn to In is very high, In is sufficiently protected by Zn (defects are very few), and as a result, the semiconductor nanoparticle exhibits excellent air durability.

Here, as described above, it is found that air durability is greatly improved by setting the Zn/In within a specific range. In other words, it is found that a criticality is observed between the Zn/In and air durability.

The reason for this is considered as follows. In a case where the protection of In by Zn is not sufficient even with a content of Zn higher than that of In, oxygen or water in the air permeates through minute defects, and oxidation of semiconductor nanoparticles occurs. Therefore, by setting an amount of Zn to be 7 times or more than that of In in terms of a molar ratio, defects are almost eliminated and oxygen or water in the air is almost completely shut down. As a result, air durability is greatly improved.

For example, in a case where the semiconductor nanoparticle according to the embodiment of the present invention is a core shell particle having an InP core and a ZnS shell which is one of preferred embodiments described later, and even with an amount of Zn larger than that of In, covering the InP core with the ZnS shell is insufficient, that is, the protection of the InP core is not sufficient, oxygen or water in the air permeates through an exposed portion of the InP core or minute defects, and oxidation of semiconductor nanoparticles occurs. Meanwhile, it is considered that by setting the amount of Zn to be 7 times or more than that of In in terms of a molar ratio, insufficient covering of the InP core is almost prevented, defects are almost eliminated, oxygen or water in the air is almost completely shut down, and as a result, air durability is greatly improved.

In addition, as described later, from the viewpoint of further improving air durability, the semiconductor nanoparticle according to the embodiment of the present invention is preferably an embodiment that a peak A is detected in 300 to 400 $cm^{-1}$ and a peak B (peak considered to be derived from MgS or ZnMgS) is detected in 100 to 130 $cm^{-1}$ by Raman spectroscopy. The reason for the improvement of air durability by employing the embodiment is not clear in detail, but is assumed that because of the low reduction potential of Mg, oxidation of Zn (for example, the ZnS shell in a case of the above-described core shell particle having the InP core and the ZnS shell) is suppressed by self-oxidation of Mg.

Hereinafter, the semiconductor nanoparticle according to the embodiment of the present invention will be described in detail.

[Zinc, Sulfur, and Indium]

As described above, in the semiconductor nanoparticle according to the embodiment of the present invention, zinc, sulfur, and indium are detected by energy dispersive X-ray analysis (EDX). In other words, the semiconductor nanoparticle according to the embodiment of the present invention contains zinc (Zn), sulfur (S), and indium (In).

[Zn/In]

In the semiconductor nanoparticle according to the embodiment of the present invention, a molar ratio Zn/In (Zn/In) of zinc to indium which is acquired by the energy dispersive X-ray analysis satisfies Expression (1a).

$$7 \leq Zn/In \leq 15 \quad (1a)$$

From the viewpoint of obtaining excellent effects of the present invention, the Zn/In preferably satisfies Expression (1b), more preferably satisfies Expression (1c), still more preferably satisfies Expression (1d), and particularly preferably satisfies Expression (1e).

$$7 \leq Zn/In \leq 12 \quad (1b)$$

$$9 \leq Zn/In \leq 12 \quad (1c)$$

$$9 \leq Zn/In < 12 \quad (1d)$$

$$9 < Zn/In < 12 \quad (1e)$$

The Zn/In is acquired as follows.

First, a toluene dispersion liquid of semiconductor nanoparticles is applied onto a non-doped Si substrate and dried to obtain a sample for EDX analysis. Then, EDX analysis is performed on the obtained sample under the following conditions using the following device and the like (device, detector, and software) to acquire the Zn/In.

(Device and the Like)
Device: Miniscope TM1000 manufactured by Hitachi High-Technologies Corporation
Detector: Manufactured by Oxford Instruments
Software: SwiftED-TM
(Conditions)
Integration time: 30 seconds
Acceleration voltage: 15 kV
Measurement range: 100 μm×100 μm

[Peaks A and B]

From the viewpoint of obtaining excellent effects of the present invention, in the semiconductor nanoparticle according to the embodiment of the present invention, it is preferable that a peak A is detected in 300 to 400 cm$^{-1}$ and a peak B is detected in 100 to 130 cm$^{-1}$ by Raman spectroscopy.

<Peak A>

The peak A is considered to be a peak derived from a structure containing In, such as an In-Group V semiconductor (for example, InP). For example, the fact that a peak derived from InP is detected in 300 to 400 cm$^{-1}$ is described in M. J. Seong and four others, "Size-dependent Raman study of InP quantum dots", Appl. Phys. Lett., American Institute of Physics, Jan. 13, 2003, Vol. 82, No. 2, pages 185 to 187 or the like.

<Peak B>

The peak B is considered to be a peak derived from MgS or ZnMgS.

Raman spectroscopy is performed as follows.

First, a quartz cell (optical path length of 1 mm) is charged with a toluene dispersion liquid (300 μL) of semiconductor nanoparticles to obtain a sample for Raman spectroscopy. Next, Raman spectroscopy is performed on the obtained sample as follows.

Output light of titanium-sapphire laser (wavelength: 800 nm, pulse time width: 92 fs, output: 1.8 W, repetition frequency: 1 kHz) is divided into two light rays to generate Raman excitation light (530 nm, 10 ps, 8 cm$^{-1}$) by a picosecond optical parametric amplifier and Raman detection light (531 to 680 nm) by a sapphire substrate. The Raman excitation light and the Raman detection light are radiated to the sample by a parabolic mirror and the Raman detection light transmitted through the sample is detected by a spectroscope and a charge coupled device (CCD) camera.

<B/A>

An intensity ratio B/A (hereinafter, also referred to as the "B/A" or the "B/A (Raman)") of the peak B to the peak A is not particularly limited, but preferably satisfies Expression (2a), more preferably satisfies Expression (2b), still more preferably satisfies Expression (2c), and particularly preferably Expression (2d) from the viewpoint of obtaining excellent effects of the present invention.

$$0 < B/A < 3 \quad (2a)$$

$$0.5 \leq B/A \leq 1.5 \quad (2b)$$

$$0.5 \leq B/A < 1.5 \quad (2c)$$

$$0.5 < B/A < 1.5 \quad (2d)$$

The B/A is acquired as follows.

A sample for Raman spectroscopy is prepared as described above. Raman spectroscopy is performed on the obtained sample as described above to acquire the intensity ratio (B/A) of the peak B of 100 to 130 cm$^{-1}$ to the peak A of 300 to 400 cm$^{-1}$. More specifically, the intensity ratio is acquired by performing normalization with peak intensity of the peak A and performing baseline correction on peak intensity of the peak B.

[Average Particle Diameter]

An average particle diameter of the semiconductor nanoparticle according to the embodiment of the present invention is not particularly limited, but is preferably 10 nm or less and more preferably 6 nm or less from the viewpoint of obtaining excellent effects of the present invention. The lower limit thereof is not also particularly limited, but is preferably 2 nm or greater and more preferably 3 nm or greater from the viewpoint of obtaining excellent effects of the present invention. The average particle diameter of the semiconductor nanoparticle according to the embodiment of the present invention is more preferably 3.5 nm to 5.5 nm from the viewpoint of obtaining excellent effects of the present invention.

Here, the average particle diameter is a value obtained by directly observing at least 20 particles using a transmission electron microscope, calculating the diameters of circles having the same areas as the projected areas of the particles, and arithmetically averaging these values.

PREFERRED EMBODIMENTS

From the viewpoint of obtaining excellent effects of the present invention, it is preferable that the semiconductor nanoparticle according to the embodiment of the present invention is a core shell particle.

As a first preferred embodiment in a case where the semiconductor nanoparticle according to the embodiment of the present invention is a core shell particle, an embodiment (single shell shape) in which the core shell particle includes a core containing a Group III element and a Group V element and a shell covering at least a part of a surface of the core and containing a Group II element and a Group VI element is exemplified.

As a second preferred embodiment in the case where the semiconductor nanoparticle according to the embodiment of the present invention is a core shell particle, an embodiment (multi-shell shape) in which the core shell particle includes a core containing a Group III element and a Group V element, a first shell covering at least a part of a surface of the core, and a second shell covering at least a part of the first shell is exemplified.

Among these, from the viewpoint of obtaining excellent effects of the present invention, a multi-shell shape is preferable.

In addition, from the viewpoint of obtaining excellent effects of the present invention, the semiconductor nanoparticle according to the embodiment of the present invention preferably contains magnesium (Mg).

<Core>

In the case where the semiconductor nanoparticle according to the embodiment of the present invention is a core shell particle, it is preferable that the core included in the core shell particle is a so-called Group III-V semiconductor that contains a Group III element and a Group V element from the viewpoint of obtaining excellent effects of the present invention.

(1) Group III Element

Specific examples of the Group III element include indium (In), aluminum (Al), and gallium (Ga). Among these, In is preferable from the viewpoint of obtaining excellent effects of the present invention.

(2) Group V Element

Specific examples of the Group V element include phosphorus (P), nitrogen (N), and arsenic (As). Among these, P is preferable from the viewpoint of obtaining excellent effects of the present invention.

In the present invention, a Group III-V semiconductor obtained by appropriately combining the Group III element and the Group V element exemplified above can be used as the core, but InP, InN, or InAs is preferable from the viewpoint that the luminous efficacy is further increased, the luminous half-width is narrowed, and a clear exciton peak is obtained. Among these, from the viewpoint of further increasing the luminous efficacy, InP is more preferable.

In the present invention, from the viewpoint of obtaining excellent effects of the present invention, it is preferable that the core shell particle further contains a Group II element in addition to the Group III element and the Group V element described above. Particularly in a case where the core is InP, the lattice constant is decreased by doping Zn as the Group II element and the lattice matching performance with a shell (for example, GaP, ZnS, or the like described below) having a smaller lattice constant than that of InP becomes excellent.

<Shell>

In a case where the semiconductor nanoparticle according to the embodiment of the present invention is a core shell particle having a single shell shape, it is preferable that the shell is a so-called Group II-VI semiconductor which is formed of a material covering at least a part of a surface of the core and contains a Group II element and a Group VI element.

Here, in the present invention, it is possible to confirm whether at least a part of the surface of the core is covered with the shell, for example, based on composition distribution analysis according to energy dispersive X-ray spectroscopy using a transmission electron microscope (transmission electron microscope-energy dispersive X-ray spectroscopy (TEM-EDX)).

(1) Group II Element

Specific examples of the Group II element include zinc (Zn), cadmium (Cd), and magnesium (Mg). Among these, Zn is preferable from the viewpoint of obtaining excellent effects of the present invention.

(2) Group VI Element

Specific examples of the Group VI element include sulfur (S), oxygen (O), selenium (Se), and tellurium (Te). Among these, S or Se is preferable and S is more preferable from the viewpoint of obtaining excellent effects of the present invention.

In the present invention, a Group II-VI semiconductor obtained by appropriately combining the Group II element and the Group VI element exemplified above can be used as the shell, but it is preferable that the shell is a crystal system which is the same as or similar to the core described above from the viewpoint of obtaining excellent effects of the present invention.

Specifically, ZnS or ZnSe is preferable from the viewpoint of obtaining excellent effects of the present invention, and ZnS is more preferable from the viewpoint of the safety and the like.

<First Shell>

In a case where the semiconductor nanoparticle according to the embodiment of the present invention is a core shell particle having a multi-shell shape, the first shell is a material that covers at least a part of a surface of the core.

Here, in the present invention, it is possible to confirm whether at least a part of the surface of the core is covered with the first shell, for example, based on composition distribution analysis according to energy dispersive X-ray spectroscopy using a transmission electron microscope (TEM-EDX).

In the present invention, from the viewpoint of easily suppressing defects at the interface between the core and the first shell, it is preferable that the first shell contains a Group II element or a Group III element.

Here, in a case where the first shell contains a Group III element, the Group III element contained in the first shell is a Group III element different from the Group III element contained in the core described above.

Further, in addition to a Group II-VI semiconductor and a Group III-V semiconductor described below, a Group III-VI semiconductor (such as $Ga_2O_3$, $Ga_2S_3$, or the like) containing a Group III element and a Group VI element is exemplified as the first shell containing a Group II element or a Group III element.

In the present invention, from the viewpoint of obtaining an excellent crystal phase with few defects, it is preferable that the first shell is a Group II-VI semiconductor containing a Group II element and a Group VI element or a Group III-V semiconductor containing a Group III element and a Group V element and more preferable that the first shell is a Group III-V semiconductor in which a difference in lattice constant between the above-described core and the first shell is small.

Here, in a case where the first shell is a Group III-V semiconductor, the Group III element contained in the Group III-V semiconductor is a Group III element different from the Group III element contained in the core described above.

(1) Group II-VI Semiconductor

Specific examples of the Group II element contained in the Group II-VI semiconductor include zinc (Zn), cadmium (Cd), and magnesium (Mg). Among these, Zn is preferable from the viewpoint of obtaining excellent effects of the present invention.

Further, specific examples of the Group VI element contained in the Group II-VI semiconductor include sulfur (S), oxygen (O), selenium (Se), and tellurium (Te). Among these, S or Se is preferable and S is more preferable from the viewpoint of obtaining excellent effects of the present invention.

A Group II-VI semiconductor obtained by appropriately combining the Group II element and the Group VI element exemplified above can be used as the first shell, but it is preferable that the first shell is a crystal system (for example, a zinc blende structure) which is the same as or similar to the core described above from the viewpoint of obtaining excellent effects of the present invention. Specifically, ZnSe, ZnS, or a mixed crystal of these is preferable and ZnSe is more preferable from the viewpoint of obtaining excellent effects of the present invention.

(2) Group III-V Semiconductor

Specific examples of the Group III element contained in the Group III-V semiconductor include indium (In), aluminum (Al), and gallium (Ga). Among these, Ga is preferable from the viewpoint of obtaining excellent effects of the present invention. As described above, the Group III element contained in the Group III-V semiconductor is a Group III element different from the Group III element contained in the core described above. For example, in a case where the Group III element contained in the core is In, the Group III element contained in the Group III-V semiconductor is Al, Ga, or the like.

Further, specific examples of the Group V element contained in the Group III-V semiconductor include phosphorus (P), nitrogen (N), and arsenic (As). Among these, P is preferable from the viewpoint of obtaining excellent effects of the present invention.

A Group III-V semiconductor obtained by appropriately combining the Group III element and the Group V element exemplified above can be used as the first shell, but it is preferable that the first shell is a crystal system (for example, a zinc blende structure) which is the same as or similar to the core described above from the viewpoint of obtaining excellent effects of the present invention. Specifically, GaP is preferable.

In the present invention, from the viewpoint of reducing defects of the surface of the core shell particle to be obtained, it is preferable that a difference in lattice constant between the above-described core and the first shell is small. Specifically, it is preferable that the difference in lattice constant between the above-described core and the first shell is 10% or less.

Specifically, in a case where the above-described core is InP, it is preferable that the first shell is ZnSe (difference in lattice constant: 3.4%) or GaP (difference in lattice constant: 7.1%) as described above. Particularly, from the viewpoint of obtaining excellent effects of the present invention, it is more preferable that the first shell is the same Group III-V semiconductor as the core, and is GaP in which a mixed crystal state can be easily made on the interface between the core and the first shell.

In the present invention, in a case where the first shell is a Group III-V semiconductor, the first shell may contain or dope another element (for example, the Group II element or the Group VI element described above) within the range that does not affect the magnitude correlation (core<first shell) of the band gap between the core and the first shell. Similarly, in a case where the first shell is a Group II-VI semiconductor, the first shell may contain or dope another element (for example, the Group III element or the Group V element described above) within the range that does not affect the magnitude correlation (core<first shell) of the band gap between the core and the first shell.

<Second Shell>

In a case where the semiconductor nanoparticle according to the embodiment of the present invention is a core shell particle having a multi-shell shape, the second shell is a material that covers at least a part of a surface of the above-described first shell.

Here, in the present invention, it is possible to confirm whether at least a part of the surface of the first shell is covered with the second shell, for example, based on composition distribution analysis according to energy dispersive X-ray spectroscopy using a transmission electron microscope (TEM-EDX).

In the present invention, from the viewpoints of suppressing defects at the interface between the first shell and the second shell and obtaining an excellent crystal phase with few defects, it is preferable that the second shell is a Group II-VI semiconductor containing a Group II element and a Group VI element or a Group III-V semiconductor containing a Group III element and a Group V element. Further, from the viewpoint that the material has high reactivity and a shell having higher crystallinity is easily obtained, it is more preferable that the second shell is a Group II-VI semiconductor.

In addition, examples of the Group II element, the Group VI element, the Group III element, and the Group V element include those respectively described in the section of the first shell.

A Group II-VI semiconductor obtained by appropriately combining the Group II element and the Group VI element exemplified above can be used as the second shell, but it is preferable that the second shell is a crystal system (for example, a zinc blende structure) which is the same as or similar to the core described above from the viewpoint of obtaining excellent effects of the present invention. Specifically, ZnSe, ZnS, or a mixed crystal of these is preferable and ZnS is more preferable.

A Group III-V semiconductor obtained by appropriately combining the Group III element and the Group V element exemplified above can be used as the second shell, but it is preferable that the second shell is a crystal system (for example, a zinc blende structure) which is the same as or similar to the core described above from the viewpoint of obtaining excellent effects of the present invention. Specifically, GaP is preferable.

In the present invention, from the viewpoint of reducing defects of the surface of the core shell particle to be obtained, it is preferable that a difference in lattice constant between the above-described first shell and the second shell is small. Specifically, it is preferable that the difference in lattice constant between the above-described first shell and the second shell is 10% or less.

Specifically, in a case where the above-described first shell is GaP, it is preferable that the second shell is ZnSe (difference in lattice constant: 3.8%) or ZnS (difference in lattice constant: 0.8%) as described above and more preferable that the second shell is ZnS.

In the present invention, in a case where the second shell is a Group II-VI semiconductor, the second shell may contain or dope another element (for example, the Group III element or the Group V element described above) within the range that does not affect the magnitude correlation (core<second shell) of the band gap between the core and the second shell. Similarly, in a case where the second shell is a Group III-V semiconductor, the second shell may contain or dope another element (for example, the Group II element or the Group VI element described above) within the range that does not affect the magnitude correlation (core<second shell) of the band gap between the core and the second shell.

In the present invention, from the viewpoint that epitaxial growth becomes easy and defects at an interface between layers are easily suppressed, it is preferable that each of the core, the first shell, and the second shell described above is a crystal system having a zinc blende structure.

In the present invention, from the viewpoint that the probability of excitons staying in the core becomes higher and the luminous efficacy is further increased, the semiconductor nanoparticle is preferably a core shell particle in which the band gap of the core is the smallest among the core, the first shell, and the second shell described above and the core and the first shell respectively have a type 1 (type I) band structure.

<Mg>

As described above, from the viewpoint of obtaining excellent effects of the present invention, the semiconductor nanoparticle according to the embodiment of the present invention preferably contains magnesium (Mg).

From the viewpoint of obtaining excellent effects of the present invention, the semiconductor nanoparticle according to the embodiment of the present invention contains Mg preferably in a form of ZnMgS or MgS and more preferably in a form of a ZnMgS layer or a MgS layer in the vicinity of the surface of the semiconductor nanoparticles. In a case where the semiconductor nanoparticle according to the embodiment of the present invention contains ZnMgS or MgS, it is considered that the above-described peak B is detected.

Hereinafter, a semiconductor nanoparticle containing Mg is also referred to as a "semiconductor nanoparticle (with Mg)" and a semiconductor nanoparticle not containing Mg is also referred to as a "semiconductor nanoparticle (without Mg)".

<Coordination Molecule>

From the viewpoint of imparting dispersibility, it is desirable that the semiconductor nanoparticle according to the embodiment of the present invention has coordination molecules on the surface.

From the viewpoint of dispersibility in a solvent, it is preferable that the coordination molecules contain an aliphatic hydrocarbon group.

Further, from the viewpoint of improving the dispersibility, a coordination molecule is preferably a ligand in which the number of carbon atoms in the main chain is at least 6 and more preferably a ligand in which the number of carbon atoms in the main chain is 10 or greater.

The coordination molecule may be a saturated compound or an unsaturated compound, specific examples thereof include decanoic acid, lauric acid, myristic acid, palmitic acid, stearic acid, behenic acid, oleic acid, erucic acid, oleylamine, dodecylamine, dodecanethiol, 1,2-hexadecanethiol, trioctylphosphine oxide, and cetrimonium bromide, and these may be used alone or in combination of two or more kinds thereof.

[Method of Producing Semiconductor Nanoparticles]

A method of producing the semiconductor nanoparticle according to the embodiment of the present invention is not particularly limited, and examples thereof include a method of mixing a compound containing zinc, a compound containing sulfur, and a compound containing indium in a solvent. At this time, semiconductor nanoparticles satisfying Expression (1a) can be obtained by adjusting the amount of the compound containing zinc to be blended and the amount of the compound containing indium to be blended.

From the viewpoint that air durability of the obtained semiconductor nanoparticles is more improved (hereinafter, also referred to as "viewpoint of obtaining excellent effects of the present invention"), the method of producing the semiconductor nanoparticle according to the embodiment of the present invention is preferably a first preferred embodiment or a second preferred embodiment described later and more preferably the second preferred embodiment.

First Preferred Embodiment

As a first preferred embodiment of the method of producing the semiconductor nanoparticle according to the embodiment of the present invention, a production method including a first step to a fourth step described below is exemplified. According to the first preferred embodiment, a semiconductor nanoparticle (without Mg) including a core, a first shell which covers a surface of the core, and a second shell which covers a surface of the first shell can be obtained.

(1) A first step of heating and stirring a solution obtained by adding a Group III raw material which contains a Group III element to a solvent (2) A second step of forming a core by adding a Group V raw material which contains a Group V element to the solution after the first step (3) A third step of forming a first shell by adding a raw material of the first shell to the solution after the second step (4) A fourth step of synthesizing the semiconductor nanoparticle by adding a Group II raw material which contains a Group II element to the solution after the third step to form the second shell Hereinafter, each step will be described.

(First Step)

The first step is a step of heating and stirring a solution obtained by adding a Group III raw material which contains a Group III element to a solvent.

(1) Solvent

Preferred examples of the solvent used in the first step include non-polar solvents having a boiling point of 170° C. or higher.

Specific examples of the non-polar solvents include aliphatic saturated hydrocarbon such as n-decane, n-dodecane, n-hexadecane, or n-octadecane; aliphatic unsaturated hydrocarbon such as 1-undecene, 1-dodecene, 1-hexadecene, or 1-octadecene; and trioctylphosphine.

Among these, aliphatic unsaturated hydrocarbon having 12 or greater carbon atoms is preferable and 1-octadecene is more preferable from the viewpoint of obtaining excellent effects of the present invention.

(2) Group III Raw Material

Specific examples of the Group III raw material to be added to the solvent include indium chloride, indium oxide, indium acetate, indium nitrate, indium sulfate, and indium acid; aluminum phosphate, aluminum acetylacetonate, aluminum chloride, aluminum fluoride, aluminum oxide, aluminum nitrate, and aluminum sulfate; and gallium acetylacetonate, gallium chloride, gallium fluoride, gallium oxide, gallium nitrate, and gallium sulfate, and these may be used alone or in combination of two or more kinds thereof.

Among these, from the viewpoints of easily realizing excellent luminous efficacy and easily controlling the emission wavelength in a visible range, an indium compound is preferable. From the viewpoint that impurity ions such as a chloride are unlikely to be taken into the core and high crystallinity is easily realized, it is more preferable to use indium acetate.

(3) Group II Raw Material

A Group II raw material containing a Group II element may be added together with the Group III raw material described above in the first step.

Specific examples of the Group II raw material including a Group II element include dimethyl zinc, diethyl zinc, zinc carboxylate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc acetate, and zinc sulfate.

From the viewpoint of obtaining excellent effects of the present invention, as the Group II raw material, zinc acetate which is acetate of Zn or zinc chloride is preferably used and zinc acetate is more preferably used.

(4) Coordination Molecule

Coordination molecules may be added to the solvent in the first step. Examples of the coordination molecules used are the same as those described above. Among those, from the viewpoints of promoting the synthesis of the core and having an appropriate coordination force with respect to the core, oleic acid, palmitic acid, or stearic acid is preferable.

(5) Conditions for Heating and Stirring

In the first step, from the viewpoint of obtaining excellent effects of the present invention, it is preferable that the above-described respective materials (the Group III raw material, the Group II raw material, and the coordination molecules) are dissolved in the above-described solvent and also preferable that the respective materials are dissolved in the solvent by heating and stirring the solution, for example, in a temperature range of 100° C. to 180° C. At this time, from the viewpoint of obtaining excellent effects of the present invention, it is preferable that dissolved oxygen or moisture is removed from the mixed solution, in which the respective materials have been dissolved, by heating the solution under reduced pressure.

Further, the time required for heating and dissolving is preferably 30 minutes or longer from the viewpoint of obtaining excellent effects of the present invention.

(Second Step)

The second step is a step of forming a core which is a Group III-V semiconductor by adding a Group V raw material which contains a Group V element to the solution after the first step.

(1) Group V Raw Material

Specific examples of the Group V raw material containing a Group V element include tristrialkylsilylphosphine, trisdialkylsilylphosphine, and trisdialkylaminophosphine; arsenic oxide, arsenic chloride, arsenic sulfate, arsenic bromide, and arsenic iodide; and nitric oxide, nitric acid, and ammonium nitrate.

Among these, a compound containing P is preferable from the viewpoint of obtaining excellent effects of the present invention. As the compound, it is preferable to use tristrialkylsilylphosphine or trisdialkylaminophosphine. Specifically, it is more preferable to use tristrimethylsilylphosphine.

(Third Step)

The third step is a step of forming a first shell by adding a raw material of the first shell to the solution after the second step. In this manner, a semiconductor nanoparticle precursor including the core and the first shell is obtained.

Here, as the raw material of the first shell, a Group II raw material containing the Group II element described above and a Group VI raw material containing the Group VI element described below are exemplified in a case where the first shell is the Group II-VI semiconductor described above; and a Group III raw material containing the Group III element described above and a Group V raw material containing the Group V element described above are exemplified in a case where the first shell is the Group III-V semiconductor described above.

Here, in a case where the first shell is the Group III-V semiconductor described above, the Group III element contained in the Group III-V semiconductor is a Group III element different from the Group III element contained in the core described above.

Further, in a case where the first shell is the Group III-V semiconductor described above, since the Group V raw material containing a Group V element may be the same raw material as the Group V raw material forming the core, a part of the Group V raw material used in the second step may be used and only the Group III raw material may be added in the third step.

(1) Group VI Raw Material

Specific examples of the Group VI raw material containing a Group VI element include sulfur, alkylthiol, trialkylphosphine sulfide, trialkenylphosphine sulfide, alkylamino sulfide, alkenylamino sulfide, cyclohexyl isothiocyanate, and diethyl dithiocarbamic acid; and trialkylphosphine selenium, trialkenylphosphine selenium, alkylamino selenium, alkenylamino selenium, trialkylphosphine telluride, trialkenylphosphine telluride, alkylamino telluride, and alkenylamino telluride.

Among these, from the viewpoint of excellent dispersibility of semiconductor nanoparticles to be obtained, it is preferable to use alkylthiol, specifically, more preferable to use dodecanethiol or octanethiol, and still more preferable to use dodecanethiol.

Among these materials, it is preferable to use the Group III raw material and the Group V raw material.

Particularly, as the Group III raw material, it is more preferable to use a compound containing Ga (such as gallium acetylacetonate, gallium chloride, gallium fluoride, gallium oxide, gallium nitrate, or gallium sulfate) and still more preferable to use a chloride of Ga.

In addition, as the Group V raw material, it is preferable to use a part of the Group V raw material used in the second step as described above.

(Fourth Step)

The fourth step is a step of synthesizing the semiconductor nanoparticle (without Mg) by adding a Group II raw material containing a Group II element to the solution after the third step to form the second shell.

Here, as the raw material of the second shell, a Group II raw material containing the Group II element described above and a Group VI raw material containing the Group VI element described above are exemplified in a case where the second shell is the Group II-VI semiconductor described above.

From the viewpoint of obtaining excellent effects of the present invention, as the Group II raw material, it is preferable to use fatty acid zinc (such as zinc acetate, zinc oleate, or zinc stearate) or zinc diethyl dithiocarbamate, more preferable to use fatty acid zinc, and still more preferable to use zinc oleate.

Further, from the viewpoint of obtaining excellent effects of the present invention, as the Group VI raw material, it is preferable to use alkylthiol and more preferable to use dodecanethiol.

Second Preferred Embodiment

As a second preferred embodiment of the method of producing the semiconductor nanoparticle according to the embodiment of the present invention, a method further including the following fifth step after the fourth step of the first preferred embodiment (production method which includes the first step to the fourth step) described above is exemplified. According to the second preferred embodiment, a semiconductor nanoparticle (with Mg) including a core, a first shell which covers a surface of the core, a second shell which covers a surface of the first shell, and a magnesium-containing layer (layer containing magnesium) (preferably, a ZnMgS layer or a MgS layer) which covers a surface of the second shell can be obtained.

(Fifth Step)

The fifth step is a step of synthesizing the semiconductor nanoparticle (with Mg) by adding a magnesium raw material to the solution after the fourth step to form the magnesium-containing layer.

(1) Magnesium Raw Material

A magnesium raw material is not particularly limited, but fatty acid magnesium is preferable from the viewpoint of obtaining excellent effects of the present invention. From the viewpoint of obtaining excellent effects of the present invention, the fatty acid magnesium is preferably magnesium acetate, magnesium oleate, or magnesium stearate and more preferably magnesium oleate.

Further, in the fifth step, from the viewpoint of obtaining excellent effects of the present invention, it is preferable that a Group VI raw material is added together with the magnesium raw material. Specific examples and preferred embodiments of the Group VI raw material are the same as those of the Group VI raw material used in the third step described above.

<Number of Times of Lamination Treatment>

In the first preferred embodiment and the second preferred embodiment described above, from the viewpoint of obtaining excellent effects of the present invention, it is preferable that the fourth step (lamination treatment) is performed multiple times. From the viewpoint of obtaining excellent effects of the present invention, the number of times of the lamination treatment is preferably 3 to 10 and more preferably 4 to 6.

<Group II Raw Material/Group III Raw Material (Preparation)>

In the first preferred embodiment and the second preferred embodiment described above, a molar ratio (hereinafter, also referred to as "Group II raw material/Group III raw material (preparation)") of the Group II raw material added in the first to fourth steps to the Group III raw material added in the first step is preferably 7 to 20, more preferably 9 to 15, and still more preferably 10 to 12 from the viewpoint of obtaining excellent effects of the present invention. In a case where the fourth step is a plurality of lamination treatments, the amount of the Group II raw material added in the fourth step refers to a total amount of the Group II raw materials added in all the lamination treatments.

Hereinafter, in a case where a Group III element of the Group III raw material added in the first step is In and a Group II element of the Group II raw material added in the first to fourth steps is Zn, the "Group II raw material/Group III raw material (preparation)" is also referred to as the "Zn/In (preparation)".

<Magnesium Raw Material/Group III Raw Material (Preparation)>

In the second preferred embodiment described above, a molar ratio (hereinafter, also referred to as "magnesium raw material/Group III raw material (preparation)") of the magnesium raw material added in the fifth step to the Group III raw material added in the first step is preferably 0.01 to 10, more preferably 0.1 to 3, still more preferably 0.2 to 1.5, particularly preferably 0.3 to 0.8, and most preferably 0.4 to 0.6 from the viewpoint of obtaining excellent effects of the present invention.

Hereinafter, in a case where a Group III element of the Group III raw material added in the first step is In, the "magnesium raw material/Group III raw material (preparation)" is also referred to as the "Mg/In (preparation)".

<Mg Addition Temperature>

In the second preferred embodiment described above, a temperature (hereinafter, also referred to as a "Mg addition temperature") at the time of adding the magnesium raw material in the fifth step is preferably 100° C. to 400° C., more preferably 190° C. to 300° C., and still more preferably 210° C. to 250° C. from the viewpoint of obtaining excellent effects of the present invention.

[Semiconductor Nanoparticle-Containing Dispersion Liquid]

A semiconductor nanoparticle-containing dispersion liquid according to the embodiment of the present invention (hereinafter, also referred to as "dispersion liquid according to the embodiment of the present invention") is a dispersion liquid containing the semiconductor nanoparticle according to the embodiment of the present invention described above.

Here, a solvent constituting a dispersion medium of the dispersion liquid is preferably a non-polar solvent.

Specific examples of the non-polar solvent include aromatic hydrocarbon such as toluene; alkyl halide such as chloroform; aliphatic saturated hydrocarbon such as hexane, octane, n-decane, n-dodecane, n-hexadecane, or n-octadecane; aliphatic unsaturated hydrocarbon such as 1-undecene, 1-dodecene, 1-hexadecene, or 1-octadecene; and trioctylphosphine.

The content (concentration) of the semiconductor nanoparticle according to the embodiment of the present invention in the dispersion liquid according to the embodiment of the present invention is preferably 0.1 to 100 mol/L and more preferably 0.1 to 1 mol/L.

The semiconductor nanoparticles according to the embodiment of the present invention contained in the dispersion liquid according to the embodiment of the present invention may be used alone or in combination of two or more kinds thereof.

[Film]

A film according to the embodiment of the present invention is a film containing the semiconductor nanoparticle according to the embodiment of the present invention described above.

Since such a film according to the embodiment of the present invention exhibits excellent air durability, the film can be applied to, for example, a wavelength conversion film for a display, a photoelectric conversion (or wavelength conversion) film of a solar cell, a biological label, a thin film transistor, and the like. In particular, the film according to the embodiment of the present invention is suitably applied to a down-conversion or down-shifting type wavelength conversion film which absorbs light in a range of shorter wavelengths than the absorption edge of quantum dots and emits light of longer wavelengths.

Further, a film material as a base material constituting the film according to the embodiment of the present invention is not particularly limited and may be a resin or a thin glass film.

Specific examples thereof include resin materials mainly formed of an ionomer, polyethylene, polyvinyl chloride, polyvinylidene chloride, polyvinyl alcohol, polypropylene, polyester, polycarbonate, polystyrene, polyacrylonitrile, an ethylene-vinyl acetate copolymer, an ethylene-vinyl alcohol copolymer, an ethylene-methacrylic acid copolymer film, and nylon.

EXAMPLES

Hereinafter, the present invention will be described in more detail based on examples. However, the present invention is not limited to these examples.

[Production of Semiconductor Nanoparticle (without Mg)]

By performing the following first to fourth steps, a semiconductor nanoparticle (without Mg) including InP (core) doped with Zn, GaP (first shell) covering the surface of the core, and ZnS (second shell) covering the surface of the first shell was produced.

<First Step>

16 mL of octadecene, 70 mg (0.24 mmol) of indium acetate, and 24 mg (0.12 mmol) of zinc acetate were added to a flask, heated and stirred at 110° C. in a vacuum, and degassed for 90 minutes while the raw materials were sufficiently dissolved.

<Second Step>

Next, the flask was heated to 300° C. in a nitrogen flow, and 0.12 mmol of tristrimethylsilylphosphine dissolved in approximately 2 mL of octadecene was added to the flask at the time of the temperature of the solution being stabilized.

Thereafter, the flask was heated for 120 minutes in a state in which the temperature of the solution was set to 230° C. It was confirmed that the color of the solution became red and particles (core) were formed.

<Third Step>

Next, 15 mg (0.09 mmol) of gallium chloride and 62.5 µL (0.2 mmol) of oleic acid which were dissolved in 4 mL of octadecene were added to the solution in a state in which the solution was heated to 200° C., and the solution was further heated for approximately 1 hour, thereby obtaining a dispersion liquid of a semiconductor nanoparticle precursor including InP (core) doped with Zn and GaP (first shell).

<Fourth Step>

Thereafter, ZnS (second shell) covering the surface of the first shell was formed.

Specifically, the temperature was held to 150° C. to 240° C., a Group II raw material (for example, fatty acid zinc (such as zinc acetate, zinc oleate, or zinc stearate) or zinc diethyl dithiocarbamate) and a Group VI raw material (for example, sulfur (ODE-S) dissolved in octadecene, sulfur (TOP-S) dissolved in trioctylphosphine, or linear alkanethiol (such as butanethiol, octanethiol, or dodecanethiol)) were alternately added thereto, and the state thereof was held for 15 minutes to 4 hours (lamination treatment). The lamination treatment was repeated approximately 5 times while adjusting the concentration of the raw materials added to form ZnS (second shell).

In this manner, a semiconductor nanoparticle (without Mg) including InP (core) doped with Zn, GaP (first shell) covering the surface of the core, and ZnS (second shell) covering the surface of the first shell was obtained.

[Production of Semiconductor Nanoparticle (with Mg)]

By further performing the following fifth step after the above-described fourth step, a ZnMgS layer or a MgS layer covering the surface of the second shell was formed, and a semiconductor nanoparticle (with Mg) including InP (core) doped with Zn, GaP (first shell) covering the surface of the core, ZnS (second shell) covering the surface of the first shell, and a ZnMgS layer or a MgS layer covering the surface of the second shell was produced.

<Fifth Step>

A magnesium raw material (for example, fatty acid magnesium (for example, magnesium oleate or the like)) was added over 30 minutes after 1 hour passed from the addition of the Group VI raw material in the final treatment of the fourth step, a Group VI raw material (for example, sulfur (ODE-S) dissolved in octadecene, sulfur (TOP-S) dissolved in trioctylphosphine, or linear alkanethiol (such as butanethiol, octanethiol, or dodecanethiol)) was further added, and the state thereof was held for 30 minutes to form a ZnMgS layer or a MgS layer.

In this manner, a semiconductor nanoparticle (with Mg) including InP (core) doped with Zn, GaP (first shell) covering the surface of the core, ZnS (second shell) covering the surface of the first shell, and a ZnMgS layer or a MgS layer covering the surface of the second shell was obtained.

Comparative Examples 1 to 3 and Examples 1 to 11

Among the semiconductor nanoparticles (without Mg or with Mg) produced in the above-described manner, embodiments (Comparative Examples 1 to 3 and Examples 1 to 11) in which fatty acid zinc was used as the Group II raw material and dodecanethiol was used as the Group VI raw material in the fourth step will be more specifically described.

In addition, all the semiconductor nanoparticles became toluene dispersion liquids (semiconductor nanoparticle-containing dispersion liquids). Specifically, the obtained dispersion liquids were cooled to room temperature, ethanol was added thereto, and centrifugation was performed on the dispersion liquids to precipitate the particles. The supernatant was disposed of and the resultant was dispersed in a toluene solvent.

Comparative Example 1

Comparative Example 1 was a semiconductor nanoparticle (without Mg) produced in the above-described manner, and the number of times of the lamination treatment in the fourth step was as shown in Table 1.

Comparative Example 2 and Example 6

Comparative Example 2 and Example 6 were semiconductor nanoparticles (without Mg) produced in the above-described manner, and the number of times of the lamination treatment in the fourth step was as shown in Table 1.

Comparative Example 3

Comparative Example 3 was a semiconductor nanoparticle (with Mg) produced in the above-described manner, and the number of times of the lamination treatment in the fourth step was as shown in Table 1. Here, in the first step, the amount of indium acetate used was 35 mg (0.12 mmol) and 12 mg (0.06 mmol) of zinc acetate was used as the Group II raw material, in the second step, the amount of tristrimethylsilylphosphine used was 0.08 mmol, and in the third step, the amount of gallium chloride used was 0.03 mg.

Examples 1 to 5 and 7 to 11

Examples 1 to 5 and 7 to 11 were semiconductor nanoparticles (with Mg) produced in the above-described manner, and the number of times of the lamination treatment in the fourth step was as shown in Table 1.

<Zn/in (Preparation), Mg/in (Preparation), and Mg Addition Temperature>

Regarding each of Examples and Comparative Examples, Table 1 below shows:

a molar ratio (Zn/In (preparation)) of the fatty acid zinc (total) used in the first to fourth steps to the indium acetate used in the first step;

a molar ratio (Mg/In (preparation)) of the magnesium raw material used in the fifth step to the indium acetate used in the first step; and a temperature [° C.] (Mg addition temperature) at the time of adding the magnesium raw material in the fifth step.

<Zn/In (EDX)>

Regarding each of Examples and Comparative Examples, the "Zn/In" described above is shown in Table 1 below (Zn/In (EDX)). The method of acquiring the Zn/In was as described above.

Zinc, sulfur, and indium were detected by EDX analysis in all of Comparative Examples 1 to 3 and Examples 1 to 11.

<B/A (Raman)>

Regarding each of Examples and Comparative Examples, the "B/A" described above is shown in Table 1 below (B/A (Raman)). The method of acquiring the B/A was as described above.

The peak A was detected in all of Comparative Examples 1 to 3 and Examples 1 to 11.

Thereafter, the quantum yield was measured and the maintenance factor of quantum yield (=quantum yield after durability test/quantum yield before durability test×100) (%) was calculated. The results are listed in Table 1 (maintenance factor). The results indicate that the air durability is more excellent as the maintenance factor is higher.

In addition, the air durability was evaluated based on the following criteria. The results are listed in Table 1 (air durability). From the viewpoint of air durability, A to C are preferable, A or B is more preferable, and A is still more preferable.

A: Maintenance factor is 78% or more
B: Maintenance factor is 75% or more and less than 78%
C: Maintenance factor is 60% or more and less than 75%
D: Maintenance factor is 50% or more and less than 60%
E: Maintenance factor is less than 50%

TABLE 1

| | Production conditions | | | Structure | | | Evaluation | | |
|---|---|---|---|---|---|---|---|---|---|
| | Number of times of lamination treatment | Zn/In (preparation) | Mg/In (preparation) | Mg addition temperature [° C.] | Zn/In (EDX) | B/A (Raman) | Average particle diameter [nm] | Initial characteristics (%) | Maintenance factor (%) | Air durability |
| Comparative Example 1 | 1 | 2.38 | 0 | — | 2.7 | 0 | 3.3 | 75 | 45 | E |
| Comparative Example 2 | 2 | 6.13 | 0 | — | 6 | 0 | 3.5 | 76 | 59 | D |
| Comparative Example 3 | 1 | 4.25 | 0.5 | 240 | 3 | 1.1 | 3.4 | 74 | 55 | D |
| Example 1 | 3 | 8.00 | 0.5 | 240 | 7 | 1.2 | 4.2 | 72 | 75 | B |
| Example 2 | 4 | 9.88 | 0.5 | 240 | 9 | 1.1 | 4.4 | 74 | 80 | A |
| Example 3 | 5 | 11.75 | 0.5 | 240 | 10 | 1 | 4.6 | 75 | 85 | A |
| Example 4 | 6 | 13.63 | 0.5 | 240 | 12 | 0.8 | 4.9 | 74 | 78 | A |
| Example 5 | 8 | 17.38 | 0.5 | 240 | 15 | 0.9 | 5.5 | 70 | 70 | C |
| Example 6 | 5 | 11.75 | 0 | — | 9.5 | 0 | 4.5 | 76 | 70 | C |
| Example 7 | 5 | 11.75 | 0.5 | 180 | 9.8 | 0.01 | 4.6 | 76 | 72 | C |
| Example 8 | 5 | 11.75 | 0.5 | 200 | 9.3 | 0.5 | 4.4 | 74 | 75 | B |
| Example 3 | 5 | 11.75 | 0.5 | 240 | 10 | 1 | 4.6 | 75 | 85 | A |
| Example 9 | 5 | 11.75 | 0.75 | 240 | 10.5 | 1.2 | 4.6 | 69 | 80 | A |
| Example 10 | 5 | 11.75 | 1 | 240 | 10.4 | 1.5 | 4.6 | 64 | 73 | C |
| Example 11 | 5 | 11.75 | 2 | 240 | 9.8 | 3 | 4.3 | 57 | 71 | C |

On the contrary, the peak B was detected from the semiconductor nanoparticle (with Mg) (Comparative Example 3 and Examples 1 to 5 and 7 to 11), but was not detected from the semiconductor nanoparticle (without Mg) (Comparative Examples 1 and 2 and Example 6).

<Average Particle Diameter>

Regarding each of Examples and Comparative Examples, the "average particle diameter" described above is shown in Table 1 below. The method of measuring the average particle diameter was as described above.

[Evaluation]

Initial characteristics and air durability of the obtained semiconductor nanoparticles were evaluated as follows.

<Initial Characteristics>

Quantum yield (%) was measured by using the obtained semiconductor nanoparticle-containing dispersion liquid. The results are listed in Table 1 (initial characteristics).

<Air Durability>

The obtained semiconductor nanoparticle-containing dispersion liquid (500 μm) was exposed to the air (20° C., relative humidity of 30%), and was allowed to stand at 85° C. for 24 hours in a light-shielding state (durability test).

Two Examples 3 in Table 1 are the same.

As shown in Table 1, Examples 1 to 11 in which the Zn/In was 7 Zn/In 15 exhibited excellent air durability compared to Comparative Examples 1 to 3 in which the Zn/In was less than 7. Here, as can be seen from the comparison among Comparative Example 1 in which the Zn/In was 2.7, Comparative Example 2 in which the Zn/In was 6, and Example 6 in which the Zn/In was 7 or more, air durability was greatly improved by setting the Zn/In to 7 or more. In other words, a criticality was observed between the Zn/In and air durability.

As can be seen from the comparison among Examples 1 to 5 (comparison between the embodiments in which the Mg/In (preparation) was 0.5 and the Mg addition temperature was 240° C.), Examples 1 to 4 in which the Zn/In was 7≤Zn/In≤12 exhibited more excellent initial characteristics and air durability. Among them, Examples 2 to 4 in which the Zn/In was 9≤Zn/In≤12 exhibited further excellent initial characteristics and air durability. Among them, Examples 2 and 3 in which the Zn/In was 9≤Zn/In<12 exhibited further excellent air durability. Among them, Example 3 in which the Zn/In was 9<Zn/In<12 exhibited further excellent initial characteristics and air durability.

As can be seen from the comparison among Examples 3 and 6 to 11 (comparison between the embodiments in which the Zn/In (preparation) was 11.75), Examples 3 and 7 to 11 in which the peak B was detected exhibited more excellent air durability. Among them, Examples 3 and 7 to 10 in which the B/A was 0<B/A<3 exhibited further excellent initial characteristics and air durability. Among them, Examples 3 and 8 to 10 in which the B/A was 0.5≤B/A≤1.5 exhibited further excellent air durability. Among them, Examples 3, 8, and 9 in which the B/A was 0.5≤B/A<1.5 exhibited further excellent air durability. Among them, Examples 3 and 9 in which the B/A was 0.5<B/A<1.5 exhibited further excellent air durability. Among them, Example 3 in which the B/A was 0.5<B/A<1.2 exhibited further excellent initial characteristics and air durability.

As can be seen from the comparison among Examples 3, 7, and 8 (comparison between the embodiments in which the Zn/In (preparation) was 11.75 and the Mg/In (preparation) was 0.5), Examples 3 and 8 in which a Mg addition temperature was 190° C. or higher exhibited more excellent air durability. Among them, Example 3 in which a Mg addition temperature was 210° C. or higher exhibited further excellent initial characteristics and air durability.

Further, even in the embodiment in which Group II raw materials other than fatty acid zinc were used as the Group II raw material in the fourth step and the embodiment in which Group VI raw materials other than dodecanethiol were used as the Group VI raw material in the fourth step, the "Zn/In", the "B/A", and the "average particle diameters" were measured in the same manner as in Comparative Examples 1 to 3 and Examples 1 to 11 described above. The results thereof were the same as those listed in Table 1, and the initial characteristics and the maintenance factor also tended to be the same as those listed in Table 1.

Further, a semiconductor nanoparticle (semiconductor nanoparticle in which ZnS (shell) covered the surface of InP (core) doped with Zn) having a single shell shape was produced according to the same procedures as in Comparative Examples 1 to 3 and Examples 1 to 11 described above, except that the third step described above was not performed. Then, the "Zn/In", the "B/A", and the "average particle diameter" were measured in the same manner as in Comparative Examples 1 to 3 and Examples 1 to 11 described above. The results thereof were the same as those listed in Table 1, and the initial characteristics and the maintenance factor also tended to be the same as those listed in Table 1.

What is claimed is:

1. A semiconductor nanoparticle,
   wherein zinc, sulfur, and indium are detected by energy dispersive X-ray analysis,
   a molar ratio Zn/In of zinc to indium which is acquired by the energy dispersive X-ray analysis satisfies Expression (1a), and
   a peak A is detected in 300 to 400 $cm^{-1}$ and a peak B is detected in 100 to 130 $cm^{-1}$ by Raman spectroscopy, $$7 \leq Zn/In \leq 15 \qquad (1a).$$

2. The semiconductor nanoparticle according to claim 1, wherein an intensity ratio B/A of the peak B to the peak A satisfies Expression (2a), $$0 < B/A < 3 \qquad (2a).$$

3. The semiconductor nanoparticle according to claim 2, wherein the intensity ratio B/A of the peaks satisfies Expression (2b), $$0.5 \leq B/A \leq 1.5 \qquad (2b).$$

4. The semiconductor nanoparticle according to claim 1, wherein the molar ratio Zn/In satisfies Expression (1b), $$7 \leq Zn/In \leq 12 \qquad (1b).$$

5. The semiconductor nanoparticle according to claim 4, wherein the molar ratio Zn/In satisfies Expression (1c), $$9 \leq Zn/In \leq 12 \qquad (1c).$$

6. The semiconductor nanoparticle according to claim 1, wherein an average particle diameter is 6 nm or less.

7. The semiconductor nanoparticle according to claim 6, wherein the average particle diameter is 3.5 nm to 5.5 nm.

8. The semiconductor nanoparticle according to claim 1 comprising:
   a core which contains a Group III element and a Group V element; and
   a shell which covers at least a part of a surface of the core and contains a Group II element and a Group VI element.

9. The semiconductor nanoparticle according to claim 1 comprising:
   a core which contains a Group III element and a Group V element;
   a first shell which covers at least a part of a surface of the core; and
   a second shell which covers at least a part of the first shell.

10. The semiconductor nanoparticle according to claim 8, wherein the Group III element contained in the core is In, and
    the Group V element contained in the core is any one of P, N, or As.

11. The semiconductor nanoparticle according to claim 10, wherein the Group III element contained in the core is In, and
    the Group V element contained in the core is P.

12. The semiconductor nanoparticle according to claim 8, wherein the core further contains a Group II element.

13. The semiconductor nanoparticle according to claim 12, wherein the Group II element contained in the core is Zn.

14. The semiconductor nanoparticle according to claim 9, wherein the first shell contains a Group II element or a Group III element, and
    in a case where the first shell contains the Group III element, the Group III element contained in the first shell is a Group III element different from the Group III element contained in the core.

15. The semiconductor nanoparticle according to claim 9, wherein the first shell is a Group II-VI semiconductor which contains a Group II element and a Group VI element or a Group III-V semiconductor which contains a Group III element and a Group V element, and
    in a case where the first shell is the Group III-V semiconductor, the Group III element contained in the Group III-V semiconductor is a Group III element different from the Group III element contained in the core.

16. The semiconductor nanoparticle according to claim 15,
    wherein, in a case where the first shell is the Group II-VI semiconductor, the Group II element is Zn and the Group VI element is Se or S, and
    in a case where the first shell is the Group III-V semiconductor, the Group III element is Ga and the Group V element is P.

17. The semiconductor nanoparticle according to claim 15,
wherein the first shell is the Group III-V semiconductor, the Group III element is Ga, and
the Group V element is P.

18. The semiconductor nanoparticle according to claim 9,
wherein the second shell is a Group II-VI semiconductor which contains a Group II element and a Group VI element or a Group III-V semiconductor which contains a Group III element and a Group V element.

19. The semiconductor nanoparticle according to claim 18,
wherein the second shell is the Group II-VI semiconductor,
the Group II element is Zn, and
the Group VI element is S.

20. The semiconductor nanoparticle according to claim 9,
wherein the core, the first shell, and the second shell are respectively a crystal system having a zinc blende structure.

21. The semiconductor nanoparticle according to claim 9,
wherein, among the core, the first shell, and the second shell, a band gap of the core is the smallest, and
the core and the first shell respectively have a type 1 band structure.

22. A semiconductor nanoparticle-containing dispersion liquid comprising the semiconductor nanoparticle according to claim 1.

23. A film comprising the semiconductor nanoparticle according to claim 1.

* * * * *